United States Patent [19]

Hoffman

[11] Patent Number: 4,786,828
[45] Date of Patent: Nov. 22, 1988

[54] BIAS SCHEME FOR ACHIEVING VOLTAGE INDEPENDENT CAPACITANCE

[76] Inventor: Charles R. Hoffman, 1537 Shadowood La., Raleigh, N.C. 27612

[21] Appl. No.: 49,914

[22] Filed: May 15, 1987

[51] Int. Cl.[4] .................. H03K 3/26; H03K 3/353; H01L 27/08; H01L 29/78
[52] U.S. Cl. .................. 307/303; 307/304; 357/14; 357/51
[58] Field of Search ............ 307/304, 574, 575, 577, 307/581, 583, 584, 296.1, 296.2; 357/14, 51

[56] References Cited

U.S. PATENT DOCUMENTS

| | | | |
|---|---|---|---|
| 3,109,995 | 11/1963 | Wargo | 331/117 |
| 3,139,596 | 6/1964 | Johanson et al. | 332/19 |
| 3,290,618 | 12/1966 | Leysieffer | 332/30 V |
| 3,559,104 | 1/1971 | Miyahira et al. | 332/30 V |
| 3,569,865 | 3/1971 | Healey, III | 331/159 |
| 3,582,823 | 6/1971 | Pasos | 331/96 |
| 3,586,929 | 7/1971 | Burmeister | 357/89 |
| 3,909,637 | 9/1975 | Dorler | 357/14 |
| 3,962,713 | 6/1976 | Kendall et al. | 357/14 |
| 4,003,004 | 1/1977 | Fletcher et al. | 332/30 V |
| 4,005,466 | 1/1977 | Dawson | 357/23.6 |
| 4,017,885 | 4/1977 | Kendall et al. | 357/51 |
| 4,023,112 | 5/1977 | Duncker et al. | 330/282 |
| 4,143,383 | 3/1979 | Van Rooij et al. | 357/14 |
| 4,214,252 | 7/1980 | Goerth | 307/304 |
| 4,453,090 | 6/1984 | Sempel | 307/303 |
| 4,626,881 | 12/1986 | Kishi et al. | 357/51 |
| 4,698,653 | 10/1987 | Cardwell, Jr. | 357/22 |

FOREIGN PATENT DOCUMENTS 0153778 11/1981 Japan.

Primary Examiner—Stanley D. Miller
Assistant Examiner—Trong Quang Phan

[57] ABSTRACT

Described is a capacitive structure that can be fabricated with a digital MOS (Metal Oxide Semiconductor) process. The capacitive structure is comprised of two enhancement mode FET devices electrodes connected in series via their gate electrodes. The source and drain electrodes of each FET device are connected together. A third FET device, biased to operate within the linear or resistive region of its characteristic curve, is connected to the gate electrodes of the enhancement mode FET devices. The structure provides a voltage independent capacitor.

6 Claims, 3 Drawing Sheets

N- CHANNEL STRUCTURE

BIAS SCHEME FOR ACHIEVING VOLTAGE INDEPENDENT CAPACITANCE

BACKGROUND OF THE INVENTION

1. Field of the Invention

The present invention relates to capacitive structure in general and, more particularly, to providing such structure on a VLSI chip using CMOS technology.

2. Prior Art

VLSI (Very Large Scale Integration) technology has progressed to the point where it is now possible to fabricate entire electrical systems on a single silicon chip. Usually, such silicon chips are dominated by digital components such as logic and memory circuits. However, some predominately digital chips do have between one and five percent of the chip area as analog devices. The capacitor is one of the analog devices which is usually needed on the predominantly digital chip.

Since the VLSI chip is dominated by digital devices, the process is optimized around digital circuits even though it is desirable to have a fabricating process that is equally effective in manufacturing both analog and digital circuits. Even though the CMOS process is optimized around digital circuits, it is believed that the CMOS process comes closest to meeting the requirements for effectively manufacturing both digital and analog components. Stated another way, the CMOS process is extremely efficient in laying down digital components on a mixed circuit chip (i.e., a chip carrying both analog and digital circuits). It is less efficient in laying down analog circuits. However, it is more efficient in laying down analog circuits than any of the known fabricating processes where the ultimate goal is VLSI logic mixed with analog.

The use of a modified CMOS process for fabricating capacitors is well documented in the prior art. A modified CMOS process is one in which additional process steps are added in order to fabricate the analog components on the chip. Examples of modified CMOS processes are set forth in the following articles: Hodges, D., et al, "Potential of MOS Technologies for Analog Integrated Circuits," *IEEE ISSC*, June 1978, pp. 285-294; Ham, P., and Newman, D., "Digital CMOS Cell Library Adopts Analog Circuits," *Electronic Design*, Dec. 8, 1983, pp. 107-114, and Stone, D, et al, "Analog Building Blocks for Custom and Semi-custom Applications," *IEEE ISSC*, February 1984, p. 55.

In DS1639-451, U.S. Pat. No. 4,214,252, U.S. Pat. No. 4,005,466 and JP 56-153778, voltage independent capacitors have been formed by using extra process steps to generate a conductive layer under the gate oxide.

Even though the use of additional process steps is a move in the right direction, the additional process steps add cost and complexity to the final chip.

In addition, voltage dependent capacitors have been formed from PN junction devices reversed bias to form varactors. Prior art examples of this technique are given in U.S. Pats. Nos. 4,003,004; 4,143,383; 3,909,637; 3,586,929; 3,582,823; 3,569,865; 3,559,104; 3,290,618; 3,139,596 and 3,109,995. The problem with this approach is that the varactor capacitance changes with reverse voltage. Thus, as the voltage across the varactor changes the capacitance also change. Also, some of the varactors have to be biased with inductors which cannot be integrated on a chip.

SUMMARY OF THE INVENTION

It is therefore the general object of the present invention to provide a voltage independent capacitor which can be easily integrated on a chip with a digital CMOS process.

The capacitor includes two enhancement mode FET devices connected in series via their respective gate electrodes. A third enhancement mode FET device biased to function as a high impedance device is connected to the gate electrodes. The resistive/biasing network on the gates of the series connected FET devices causes an inversion layer to be formed under the gate electrodes for an entire range of signal voltages. This enables the enhancement mode FET devices (an existing digital element) to provide the capacitive function.

In a preferred embodiment of the invention the biasng network includes a plurality of P-channel FET devices connected in series. The gate electrode of the first FET device is connected to the source electrode of the third FET device, and the source electrode of said first FET device is connected to ghe gate electrode of said third FET device.

The foregoing features and advantages of this invention will be more fully described in the accompanying drawings.

DETAILED DESCRIPTION OF THE PREFERRED EMBODIMENT

Figure 2:
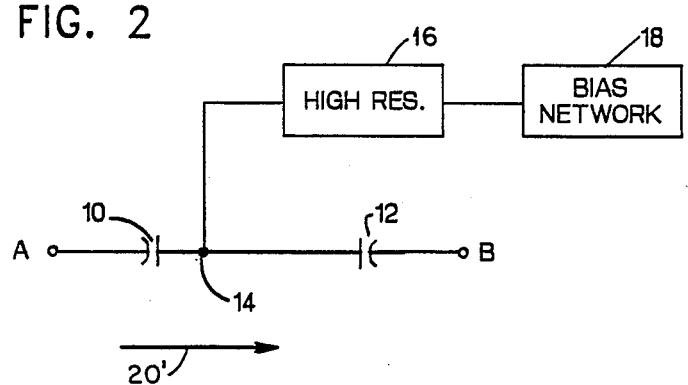
FIG. 2 shows an equivalent circuit model for the circuit of FIG. 1.

FIG. 2 shows an equivalent circuit model for a capacitive structure according to the teachings of the present invention. The capacitive structure includes two capacitors 10 and 12 (of equal values) connected in series, at node 14, between input terminal A and output terminal B, respectively. A high impedance resistor 16 and biasing network 18 are connected to node 14. Resistor 16 and biasing network 18 are connected in parallel to the series connected capacitors. The signal path between nodes A and B is shown by arrow 20'. Since capacitors 10 and 12 are in series, the equivalent capacitor $C_{eQ}$ between nodes A and B can be expressed as:

$$C_{eQ} = C1C2/(C1+C2)$$

where C1 and C2 are capacitances across capacitors 10 and 12, respectively.

If $C1 = C2 = C$, then $C$ equivalent $= \frac{1}{2}C$.

Figure 1:
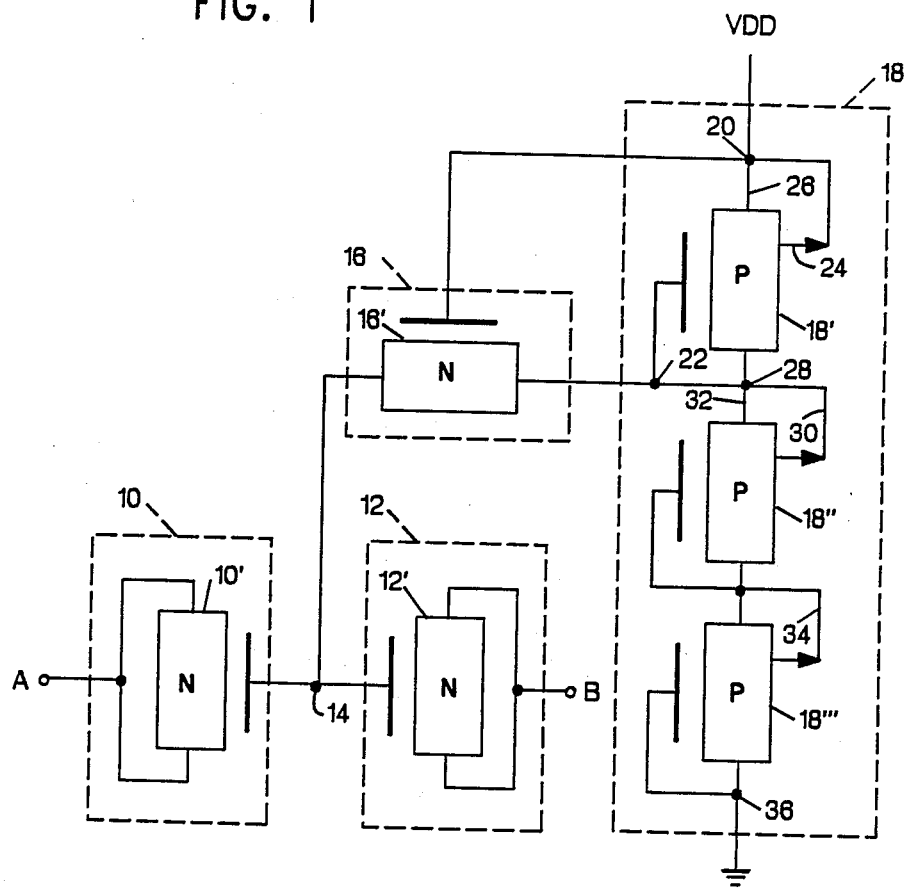
FIG. 1 shows a circuit arrangement for a capacitor according to the teachings of the present invention.

FIG. 1 shows a circuit arrangement for a capacitor according to the teachings of the present invention. Elements in FIG. 1 that are common to elements in FIG. 2 are identified by similar numerals. Capacitor 10 is formed from FET device 10'. Preferably, FET device 10' is an N-channel enhancement mode device having its gate electrode connected to node 14 and its drain and source electrodes are connected to input terminal A. Similarly, capacitor 12 includes FET device 12'. FET device 12' is an N-channel enhancement mode device having its gate electrode connected to node 14 and its source and drain electrodes connected to output node B. It should be noted that it is well within the skill of one skilled in the art to use other types of FET devices to form the series connected capacitors 10 and 12, respectively.

Still referring to FIG. 1, the gate electrodes of FET devices 10' and 12' are connected at node 14 to high impedance resistor 16. The high impedance resistor 16 is formed from FET device 16'. FET device 16' is biased so that it operates about the linear region of its characteristic curve where it looks like a linear resistor. Preferably, FET device 16' is an N-channel FET device with its gate electrode connected to node 20, its drain electrode connected to node 14 and its source electrode connected to node 22. As can be seen from FIG. 1, nodes 20 and 22 are included in biasing network 18.

Still referring to FIG. 1, the biasing network 18 includes a plurality of series connected FET devices identified by numerals 18', 18" and 18'". Preferably, each of the biasing devices are P-channel enhancement mode FETs. The string of series connected FETs 18', 18" and 18'" biases the gate of FET 16' between a first potential $V_{dd}$ and a second potential. In the preferred embodiment of this invention $V_{dd}$ is the positive voltage level of the on-chip power supply while the second potential is the ground potential of the power supply. Each of the biasing FETs 18', 18" and 18'" is a four-terminal device having a substrate electrode, a source electrode, a drain electrode, and a gate electrode. Regarding biasing device 18', the substrate electrode 24 is connected to the source electrode 26 at node 20. Also, the gate electrode of device 18' is connected to the drain electrode at nodes 22 and 28. Likewise, FET device 18" has substrate electrode 30 connected to source electrode 32 and the gate electrode is connected to the drain electrode. Finally, the substrate electrode 34 of FET device 18'" is connected to the source electrode of FET 18'". The gate electrode of FET device 18'" is connected to the drain electrode of FET 18'" at node 36. Node 36 is connected to the ground potential of the on-chip power supply. As can be seen from FIG. 1, the drain electrode of FET 18' is connected to the source electrode of FET 18" and the drain of FET 18" is connected to the source of FET 18'". As stated above, FETs 18', 18" and 18'" form a serially connected structure.

Figure 3:
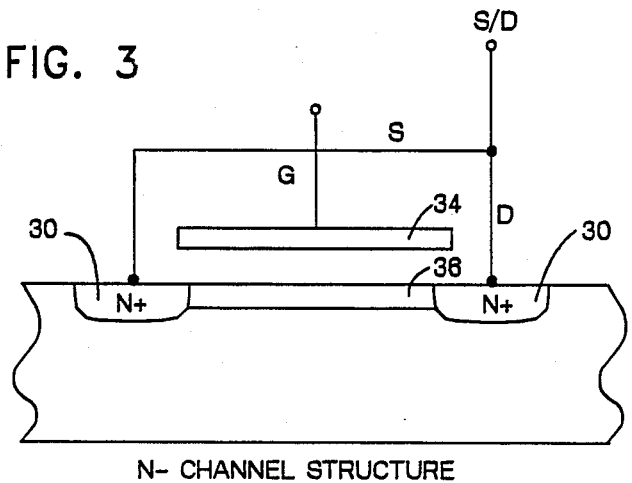
FIG. 3 shows a cross-section for each of the series connected N-channel enhancement mode FETs of FIG. 1.

FIG. 3 shows a cross-section through one of the series connected N-channel FET devices 10 or 12, respectively. The cross-section is helpful in understanding why the N-channel FET device functions as an effective capacitor. The source electrode S is connected to the N+ region 30. The drain electrode D is connected to N+ region 32. The source and drain electrodes are connected to common voltage supply source S/D. The gate electrode G is connected to the gate region 34. The gate electrode G is then connected to a biasing network such as that described above which causes a voltage on the gate so that $V_g - V_{S/D}$ is greater than the absolute value of $V_t$. Stated mathematically, the configuration provides a capacitive function if $$V_{G-S/D} > |V_t| \qquad (1)$$

where $V_g$ is a voltage on the gate electrode, $V_{S/D}$ is a voltage on the source drain electrode and $V_t$ is the threshold voltage of the FET device.

Provided that equation (1) is met, an inversion layer 36 is formed between N+ region 30 and N+ region 32. This inversion layer is a conductive layer and forms one of the plates of the capacitive structure. Likewise, gate region 34 forms the other plate of the capacitive structure. It should be noted that for N-channel FET device the conductive sheet (36) is electrons.

It should also be noted that P-channel devices can be used to fabricate the capacitive structure. In a P-channel device the source and drain electrodes are connected to displaced Pregions. With a P-channel device the capacitive function is provided if $$V_{S/D} - W_G > |V_t| \qquad (2)$$

Referring to equations 1 and 2 above, it seems as if the straightforward approach in providing the capacitive function is to bias the terminals of the FET device directly to a voltage source. However, these are some circuit applications in which the capacitor is used in a way that does not permit direct voltage bias at the capacitive terminals. Two such applications occur when a capacitor is used for a filter and a voltage control oscillator. In these applications a signal is passed through the capacitor and a direct voltage attached to either capacitor node would shunt the signal away from its intended path. In these cases, biasing as shown in FIG. 1 must be used.

It can also be shown that the structure shown in FIG. 3 provides the highest capacitive value per unit area. With reference to FIG. 3, $$C_{G-S/D} = C_{ox}(W.L)$$

$$C_{ox} = E_{ox}/t_{ox}$$

where
$C_{G-S/D}$ is the capacitance between the gate and source/drain electrodes.
$C_{ox}$ is the oxide capacitance.
$E_{ox}$ is the permitivity of the gate oxide.
$t_{ox}$ is the thickness of gate oxide.
W is the device width
and L is the device length.

Because ($t_{ox}$) the oxide thickness between the plates is extremely thin and can be controlled effectively when compared with other semiconductor structure, the FET structure of FIG. 3 provides the greatest capacitance per unit area and best achievable tolerance. Thus, a standard digital process is used to fabricate capacitors that are voltage independent with maximum capacitance per unit area and provides the best achievable tolerance within the process.

Figure 4:
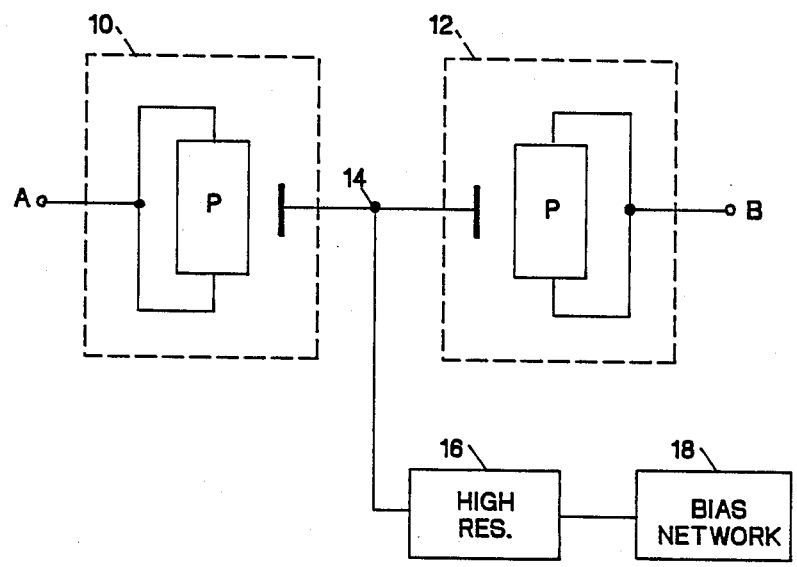
FIG. 4 shows an alternate circuit arrangement for the capacitor according to the teachings of the present invention.

FIG. 4 shows an alternate embodiment in which series-connected capacitors 10 and 12 are formed from P-channel enhancement mode FETs. High impedance resistor 16 and biasing network 18 are connected to node 14. As stated before, the high impedance resistor and biasing network is implemented with FETs.

While the invention has been particularly shown and described with reference to preferred embodiment thereof, it will be understood that various changes of form and details may be made therein without departing from the spirit and scope of the invention.

I claim:

1. A circuit arrangement for producing a constant capacitance, the capacitance value being unaffected by variations in related signal voltages, said circuit arrangement comprising:
   a first FET device having a gate electrode, a source electrode and a drain electrode, with the source electrode and the drain electrode connected together to form an input node;
   a second FET device having a gate electrode connected to the gate electrode of the first FET device, a source electrode and a drain electrode connected together to form an output node; and
   a biasing means connected to the gate electrodes of the first and second FET devices; said biasing means providing a relatively high impedance path to signals flowing between the input node and the output node and providing a selected voltage level on said gate electrode so that an inversion layer is maintained in each FET device beneath the gate electrode for an entire range of signal voltages.

2. The circuit arrangement set forth in claim 1 wherein the first and second FET devices include N-channel enhancement mode FETs.

3. The circuit arrangement set forth in claim 1 wherein the biasing means includes a third FET device having a drain electrode connected to the gate electrodes of the first and second FETs, a gate electrode and a source electrode; and
   a plurality of FET devices connected in series between a first and a second voltage reference levels and connected to the gate electrode of the third FET device.

4. The circuit arrangement of claim 3 wherein the third FET device includes an N-channel enhancement mode device.

5. The circuit arrangement of claim 3 wherein the plurality of FET devices includes a fourth, fifth and sixth P-channel FET devices with each device having a substrate electrode connected to the source electrode and the gate electrode connected to the drain electrode and adjacent FET devices interconnected via their respective source and drain electrodes.

6. The circuit arrangement of claim 1 wherein the first and second FET devices include P-channel enhancement mode FETs.

* * * * *

UNITED STATES PATENT AND TRADEMARK OFFICE
CERTIFICATE OF CORRECTION

PATENT NO. : 4,786,828

DATED : November 22, 1988

INVENTOR(S) : Charles R. Hoffman

It is certified that error appears in the above-identified patent and that said Letters Patent is hereby corrected as shown below:

Title page:

In the Abstract, line 4, delete "electrodes".

Signed and Sealed this

Third Day of October, 1989

Attest:

DONALD J. QUIGG

Attesting Officer

Commissioner of Patents and Trademarks